United States Patent [11] 3,573,508

[72] Inventor William B. Harris
Bernardsville, N.J.
[21] Appl. No. 763,262
[22] Filed Sept. 27, 1968
[45] Patented Apr. 6, 1971
[73] Assignee Bell Telephone Laboratories, Incorporated
Murray Hill, Berkeley Heights, N.J.

[54] THYRISTOR SWITCH CIRCUIT

5 Claims, 5 Drawing Figs.

[52] U.S. Cl. .... 307/284, 307/252, 307/305, 307/314
[51] Int. Cl. .... H03k 335, H03k 35, H03k 17/56
[50] Field of Search .... 307/252, 254, 305, 284; 321/11, 5

[56] References Cited
UNITED STATES PATENTS

| | | | |
|---|---|---|---|
| 3,328,667 | 6/1967 | Shaneman .... | 321/11 |
| 3,386,027 | 5/1968 | Kilgore et al. .... | 307/252 |
| 3,406,325 | 10/1968 | Rosa .... | 321/5 |
| 3,487,234 | 12/1969 | Morgan .... | 307/252 |
| 3,489,928 | 1/1970 | Harris et al. .... | 307/254 |

*Primary Examiner*—Donald D. Forrer
*Assistant Examiner*—L. N. Anagnos
*Attorneys*—R. J. Guenther and William L. Keefauver

ABSTRACT: Heretofore, when a thyristor switch circuit has employed a resonant circuit, including a series-connected inductor and capacitor, for producing a cycle of ringing current which is used for turning off the thyristor, the minimum pulse width that could be obtained was usually greater than twice the recovery time of the thyristor. It has now been discovered that an approximately 50 percent reduction in this minimum pulse width can be effected by connecting a diode in series with the inductor-capacitor combination and by placing a saturable reactor in shunt across the serially connected diode and inductor. The diode is so poled as to prevent the initial discharge current produced by the capacitor from flowing through the inductor and forces this current to flow through the saturable reactor. Since the saturable reactor is biased to present a low inductive impedance to the first half-cycle of ringing current, it reduces the duration of this first half-cycle to a very short period of time. This provides a substantially greater ratio of turnoff time to pulse width and thereby produces a much narrower pulse for a given turnoff time.

INVENTOR
W. B. HARRIS
BY
B. Stoddard
ATTORNEY

Patented April 6, 1971 3,573,508

3 Sheets-Sheet 2

Patented April 6, 1971 3,573,508

3 Sheets-Sheet 3

THYRISTOR SWITCH CIRCUIT

GOVERNMENT CONTRACT

The invention herein claimed was made in the course of, or under contract with The Department of the Army.

BACKGROUND OF THE INVENTION

This invention relates to improved semiconductor switch circuits capable of operating at rapid speeds in high-power circuits for producing rectangular pulses, and, more particularly, to means for substantially reducing the on-off time interval of a semiconductor switching circuit in order to produce narrower pulses.

Semiconductor switches of the prior art have used a variety of semiconductor devices. The semiconductor devices most commonly used in switch circuits are four-layer PNPN devices known as silicon controlled rectifiers or thyristors. As is well known, a PNPN device is usually provided with three terminals and has properties somewhat analogous to a gas-filled thyratron and, like the thyratron, once it is switched on, it remains conductive until a turnoff circuit is operated. Although the operating speed of the thyristor is inherently much greater than that of the thyratron, some utilization circuits require faster operating speeds than those for which a thyristor is inherently capable.

The need for faster operating speeds has been met by a prior art thyristor switch circuit which is disclosed and claimed in a copending patent application filed by W. B. Harris, R. P. Massey, and F. J. Zgebura. This prior application, bearing Ser. No. 537,544, was filed on Mar. 25, 1966 and is now U.S. Pat. No. 3,404,293 which is assigned to the same assignee as the present application. The circuit of this copending application is described in detail hereinafter with reference to FIG. 1 of the drawing wherein it can be seen that the switch circuit employs a single thyristor and a simple resonant turnoff circuit comprising a series connected inductor and capacitor. An impedance is connected between the gate and cathode of the thyristor to reduce false triggering from the rate effect. Both the rate effect and the turnoff capabilities are improved by connecting a diode between the gate and cathode of the thyristor, and another diode between the gate and anode of the thyristor. These diodes, which may be called reverse current diodes, are so constructed that the reverse recovery time of the middle junction in the thyristor is less than that of the first diode and greater than that of the second diode.

Although this prior art circuit has made it possible to reduce the actual recovery, or turnoff, time of a thyristor switch to one-half or less of its inherent turnoff time, it is not fully satisfactory for all purposes. The reason for this is that technological advances have developed increasing needs for still faster switching circuits. The chief obstacle to meeting these needs has resided in the restricted minimum pulse width obtainable from a thyristor having a given recovery time. For example, in this prior art circuit, the minimum pulse width obtainable is somewhat greater than twice the recovery time of the thyristor. It can therefore be understood that the principal barrier which has prevented shortening the on-off time of a thyristor switch circuit has been the recovery time of the thyristor. Thus, there is a need for means for reducing the on-off time interval of a thyristor switch circuit so as to produce narrower pulses.

SUMMARY OF THE INVENTION

The present invention is designed to increase the operating speed of a thyristor switch circuit by modifying the above-mentioned prior art circuit in such a manner as to effect an approximately 50 percent reduction in the minimum pulse width. This is accomplished by connecting a diode in series with the above-mentioned inductor-capacitor combination. In addition, a saturable reactor is placed in shunt across the serially connected diode and inductor. When the thyristor is triggered, the inductor-capacitor combination generates a cycle of ringing current. The diode is so poled as to block the flow of the first half-cycle of this ringing current which is, accordingly, forced to flow to the saturable reactor. Since the saturable reactor is biased to present a low inductive impedance to the first half-cycle of ringing current, it functions to reduce the duration of this first half-cycle to a very short period of time. This creates a substantially greater ratio of turnoff time to pulse width and thereby produces a much narrower pulse for a given recovery time. The saturable reactor does not require a conventional biasing winding because the second half-cycle of ringing current provides an automatic resetting function by biasing it to saturation.

BRIEF DESCRIPTION OF THE DRAWING

The features of this invention are fully discussed hereinafter in relation to the following detailed description of the drawing in which.

DETAILED DESCRIPTION

Figure 1:
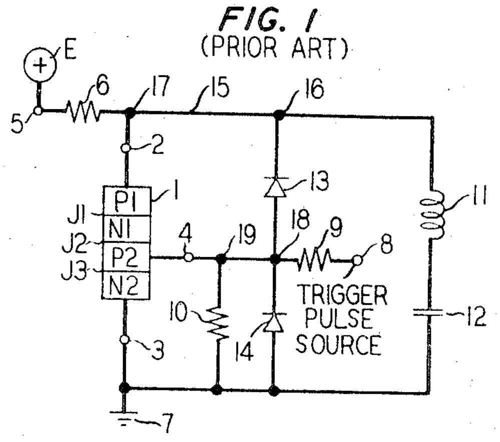
FIG. 1 (PRIOR ART)
FIG. 1 discloses the thyristor switch circuit of the above-mentioned copending application.

The switch circuit of the above-mentioned copending patent application is shown in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A power supply source of direct voltage $E$ has its positive side connected to a terminal 5. The terminal 5 is coupled to the anode terminal 2 through a utilization circuit which is represented symbolically by a load resistor 6. The cathode terminal 3 is connected to a source 7 of ground potential which is to be understood as being connected to the negative side of the source 5 of direct voltage.

The switch circuit further includes a terminal 8 which extends to an external source of trigger pulse current. The terminal 8 is coupled through a resistor 9 and the points 18 and 19 to the gate terminal 4. A resistor 10 is connected between the point 19 and the source 7 of ground potential. As is well known in the art, a positive trigger pulse applied to the terminal 8 will cause current to flow through the divider resistors 9 and 10 thereby producing a potential difference between the gate terminal 4 and the cathode terminal 3. This functions to trigger the thyristor by substantially reducing the impedance between the anode terminal 2 and the cathode terminal 3. The triggering of the thyristor 1 causes load current to flow from the source 5 of positive direct voltage, through the load resistor 6, through the anode-cathode path in the thyristor 1 to the ground 7, and then back to the negative side of the direct voltage supply.

At this point, attention should be directed to a resonant turnoff circuit that comprises an inductor 11 and a capacitor 12 which are serially connected across the anode terminal 2 and the cathode terminal 3. Prior to the triggering of the thyristor 1, the capacitor 12 is charged to approximately the same potential $E$ as that of the source 5 of direct voltage over a path extending from the load resistor 6, along the lead 15, and then through the inductor 11 to the capacitor 12.

Figure 2:
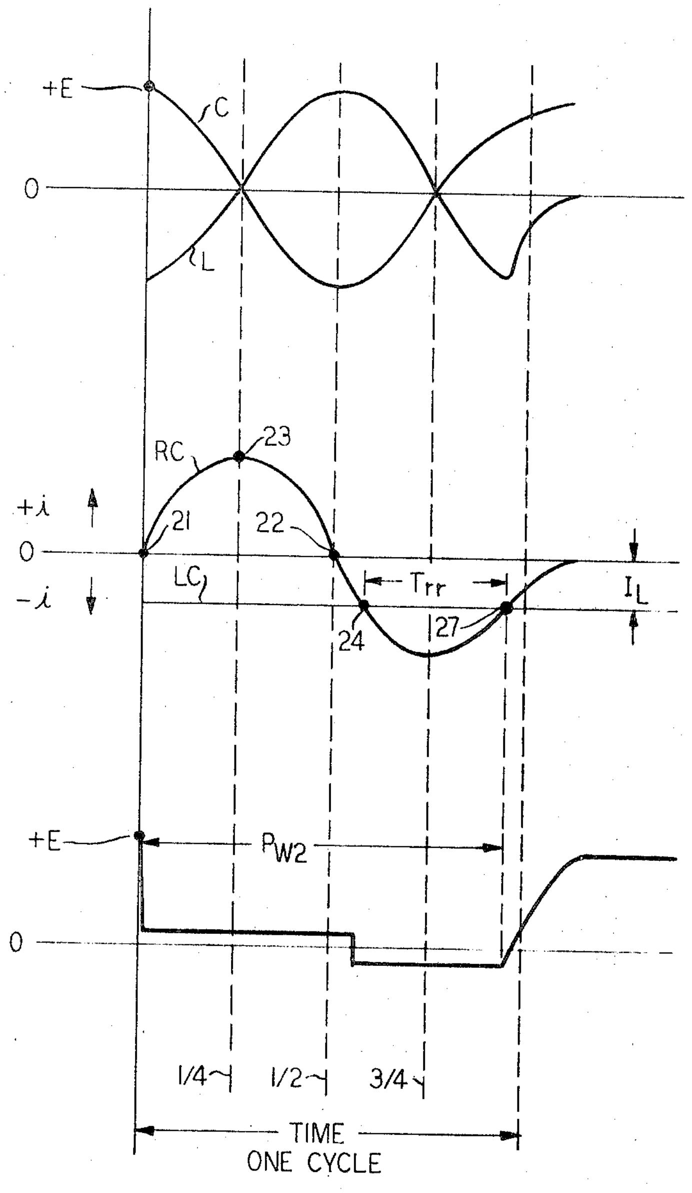
FIG. 2 is a diagram illustrating the manner in which the width of a pulse produced by the thyristor switch circuit of FIG. 1 is determined by the relationship between a cycle of turnoff current and the recovery time of the thyristor.

When the thyristor 1 is triggered, it becomes conductive and initiates the generation of a pulse across the load resistor 6. Also, at this time, in response to the thyristor 1 becoming conductive, the capacitor 12 discharges and resonates with the inductor 11. The capacitor voltage is represented in the upper portion of FIG. 2 by the curve C and the inductor voltage is illustrated by the curve L. This initiates the flow of one cycle of ringing current RC which, as is illustrated in the middle portion of FIG. 2, has an amplitude indicated by the symbol $i$. This ringing current RC is superimposed upon the load current LC which flows through the load resistor 6. As is also shown in the middle portion of FIG. 2, the amplitude of the load current LC is indicated by the symbol $I_L$. Thus, this middle portion of FIG. 2 represents the current flowing through the thyristor 1. The first half-cycle of the ringing current RC flows from the capacitor 12 through the inductor 11, over the lead 15, through the thyristor 1 in the forward direction, and then back to the capacitor 12. This first half-cycle of ringing current RC has a peak amplitude which is indicated in FIG. 2 by reference numeral 23 and has a length or duration extending from the point 21 to the point 22.

At the beginning of the second half-cycle, the ringing current RC reverses in polarity and flows through the thyristor 1 in the reverse direction. The values of the capacitor 12 and the inductor 11 are so selected as to cause the amplitude $-i$ of the reverse ringing current RC to quickly exceed the amplitude $I_L$ of the load current LC, as is represented beginning at the point 24 in FIG. 2. This produces a net reverse current which flows from the cathode terminal 3, through all three of the junctions J3, J2, and J1, and then to the anode terminal 2.

In order to reduce the time required to restore the forward-blocking capability of the thyristor 1 and also to improve its dynamic breakdown capability, two diodes 13 and 14 are serially connected across the anode terminal 2 and the cathode terminal 3, and are also connected across the inductor 11 and the capacitor 12. It can be seen in FIG. 1 that this connection uses the lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the source 8 of trigger pulse current.

As is described in the above-mentioned copending application, the lower diode 14 has a reverse recovery time which is longer than the reverse recovery time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that, shortly after the beginning of the second half-cycle of the ringing current RC, the ringing current RC will be a reverse current for the two outer junctions J1 and J3 but will be a forward current for the middle junction J2. Therefore, the slow recovery diode 14 will be momentarily reverse-biased by the charge stored in the lower junction J3 while the fast recovery diode 13 will be biased below its threshold voltage by the opposed charges in junctions J1 and J2. This condition of the diodes 13 and 14 permits the reverse ringing current RC to flow through the thyristor 1 shortly after the start of the second half-cycle. Thus, the recovery, or turnoff, time $I_{rr}$ of the thyristor 1 begins at the point 24.

The flow of reverse ringing current RC quickly functions to reduce the charge density in junction J3 to zero thereby causing it to recover and open. During the transition in junction J3, current will begin to flow through the lower diode 14 and will increase to the point at which the diode 14 will be carrying all of the reverse ringing current RC. At this time, the reverse current RC will flow from the capacitor 12, through the lower diode 14, through the gate terminal 4 and into the middle junction J2, out through the upper junction J1, and then to the inductor 11. Thus, the recovery of the lower junction J3 does not terminate the pulse since the load current LC across the load resistor 6 is maintained because it is superimposed upon the reverse ringing current RC which is now flowing through the lower diode 14.

Since the reverse ringing current RC is also a reverse current for the upper junction J1, the junction J1 will partially recover during the time that the lower junction J3 is carrying reverse current RC. After the lower junction J3 fully recovers, the above-described flow of reverse current RC through the lower diode 14 and the middle junction J2 will force the upper junction J1 to complete its recovery thereby reducing its charge density to zero. In other words, the upper junction J1 is forced to recover due to a forward current flowing through the middle junction J2.

While this change in junction J1 is occurring, the current flowing through junctions J1 and J2 will be reduced toward zero and the current flowing through the fast recovery diode 13 will be correspondingly increased to the limit of the reverse ringing current RC. This flow of current through the upper diode 13 will cause an additional charge to be stored in the lower diode 14. It should be noted that, since the middle junction J2 had been forward-biased, the charge density now existing in this junction J2 is not zero and it begins to recover by recombination. The thyristor 1 is now open at both junctions J1 and J3 and further reverse current is unnecessary except to store more charge in the slow recovery diode 14.

During the latter portion of the second half-cycle of the ringing current RC, the amplitude of the ringing current RC becomes smaller than the amplitude of the load current LC as is represented in FIG. 2 beginning at the point 27. Since the reverse recovery time of the upper diode 13 is less than the reverse recovery time of the middle junction J2, the diode 13 recovers and a second forward current is now applied to the thyristor 1. This current flows in the forward direction through the upper junction J1 and in the reverse direction through the middle junction J2 and the lower diode 14. Accordingly this current forces the middle junction J2 to recover before the diode 14 recovers by recombination. The recovery of the middle junction J2 turns off the thyristor 1 thereby marking the end of the turnoff time $I_{rr}$ and thus terminating the pulse voltage which falls with a trailing edge. The pulse will accordingly have the width $P_{w2}$ that is indicated in the lower portion of FIG. 2 which illustrates the pulse voltage at the point 17 in FIG. 1. As can be seen at the bottom of FIG. 2, the pulse does not have a precisely flat top but, instead, has a slight step formation that is caused by a voltage drop produced by the reverse diodes 13 and 14. It can also be seen that the pulse width $P_{w2}$ has a duration which is slightly less than the duration of the one cycle of ringing current RC. In other words, the duration of the width $P_{w2}$ of the pulse is limited to an extent of time that is less than the duration of the one cycle of ringing current RC. Shortly after the end of the pulse, the diode 14 finally completes its recovery, and the switch circuit then becomes ready for generating another pulse.

By thus designing diode 14 to recover more slowly than the middle junction J2, gate triggering of the thyristor 1 is prevented as is explained in the above-mentioned copending patent application. In addition, this provides a low impedance between the cathode terminal 3 and the gate terminal 4 for a short interval after the thyristor 1 recovers and thus improve the rate effect capability of this switch circuit.

The thyristor switch circuit of FIG. 1 can be adapted to produce pulses of narrower width by modifying it to include means for reducing or minimizing the duration 21—22 of the first half-cycle of ringing current RC. Since the second half-cycle of ringing current RC is used for turning off the thyristor 1, the shortening of the first half-cycle of ringing current RC provides a greater ratio of turnoff time $I_{rr}$ to pulse width and thereby produces a narrower pulse for a given turnoff time $I_{rr}$.

Figure 3:
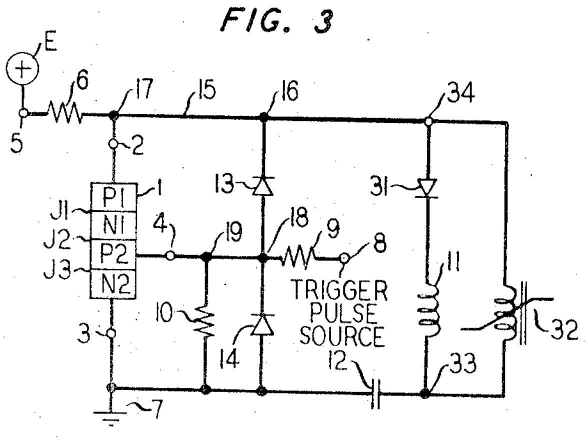
FIG. 3 shows the circuit of FIG. 1 modified in accordance with the present invention for generating a shorter cycle of turnoff current which is utilized to produce narrower pulses.

This objective can be attained by modifying the circuit of FIG. 1 in the manner indicated in FIG. 3. Since the circuit of FIG. 3 is a modification of the circuit of FIG. 1, those elements of FIG. 3 that are the same as those in FIG. 1 have been identified by giving them the same reference designations.

Figure 4:
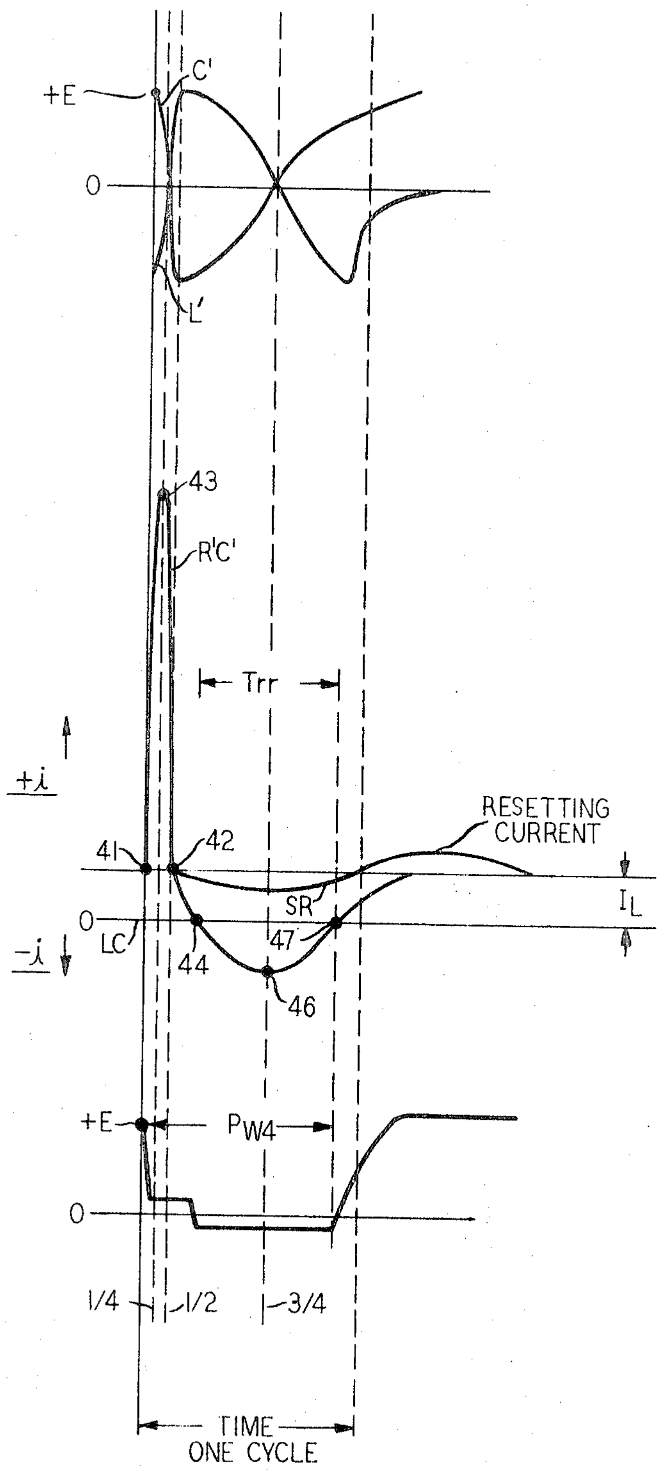
FIG. 4 is a diagram depicting a narrower pulse that is obtained by using the shorter cycle of turnoff current generated by the circuit of FIG. 3.

Thus, the circuit of FIG. 3 employs the same power supply source 5 as the circuit of FIG. 1 and consequently the value $I_L$ of the load current LC is the same in both FIGS. 2 and 4. Also, since the same resonating capacitor 12 and inductor 11 are used, the recovery, or turnoff, period $I_{rr}$ has the same duration in time in FIG. 4 that it has in FIG. 2.

When the circuit of FIG. 3 is compared with the circuit of FIG. 1, it can be be seen that a diode 31 has been added with its cathode connected to the upper end of the inductor 11 and its anode connected to a point 34 near the point 16. Also, a saturable reactor 32 has been connected between the point 34 and a point 33 which is between the lower end of the inductor 11 and the capacitor 12. Thus, the saturable reactor 32 is connected in shunt across the serially connected diode 31 and inductor 11. Initially, the reactor 32 is biased to saturation by any suitable means. Due to an automatic resetting feature that is described hereinafter for automatically biasing the reactor 32 to saturation during the operations of the switch circuit, the reactor 32 does not require a conventional biasing winding.

During the operation of the circuit shown in FIG. 3, after the thyristor 1 has been triggered in the manner described above, current from the source 5 will flow through the thyristor 1 to the ground 7. This places the points 16 and 34 at ground potential, but the discharge of the capacitor 12 through the inductor 11 is blocked by the diode 31. However, since the saturated reactor 32 now presents a very low inductive impedance to the discharging capacitor 12, the capacitor 12 discharges through the reactor 32 as is indicated in the upper portion of FIG. 4. This initiates the flow of one cycle of ringing current R'C' over the lead 15 and through the thyristor 1. Due to the very low inductive impedance of the reactor 32, the first half-cycle of this ringing current R'C' has a very high peak amplitude 43 and a very short duration extending from the point 41 to the point 42 as is shown in the middle portion of FIG. 4.

At the beginning of the second half-cycle, the ringing current R'C' reverses in polarity and flows through the thyristor 1 in the reverse direction. The reactor 32 presents a high resistive impedance to this reverse ringing current R'C' and forces most of the reverse ringing current R'C' to return to the capacitor 12 by flowing through the diode 31 and the inductor 11. However, a small portion of this reverse ringing current R'C' will flow through the reactor 32, as is indicated by the line SR in the middle portion of FIG. 4.

The reverse ringing current R'C' affects the junctions J1, J2, and J3 of the transistor 1 in the same manner as that described above for the ringing current RC. Accordingly, the recovery, or turnoff, time $I_{rr}$ of the thyristor 1 in the switch circuit of FIG. 3 will be the same as for the circuit of FIG. 1. As is indicated in the middle portion of FIG. 4, this turnoff time $I_{rr}$ begins at the point 44 and ends at the point 47. Thus, the pulse generated by the switch circuit of FIG. 3 will end at the point in time indicated by the point 47 and will have the width $P_{w4}$ that is represented in the lower portion of FIG. 4.

By comparing the diagrams shown in FIGS. 2 and 4, it can be seen that in FIG. 4 there is a greater ratio of turnoff time $T_{rr}$ to pulse width $P_{w4}$. Accordingly, the thyristor switch circuit of FIG. 3, which has the same recovery time $I_{rr}$ as the circuit of FIG. 1, produces a much narrower pulse. Thus, the circuit of FIG. 3 effects an approximately 50 percent reduction in the minimum pulse width.

It should be noted that, when the reverse ringing current reaches its peak 46 in FIG. 4, the voltage across the inductor 11 reverses. However, this voltage appears across the high resistive impedance of the reactor 32 and permits practically all of the ringing current R'C' to flow through the inductor 11 for a large part of the negative half sine wave thereby raising the voltage in the capacitor 12 to an appreciable percent of the supply voltage $E$ at the time the pulse ends.

Since there is an appreciable current in the inductor 11 when the pulse ends, and since the current SR through the reactor 32 is practically zero with a resetting voltage $L'$ across it at this time, the current SR in the reactor 32 now reverses and thus automatically resets the core of the reactor 32 in preparation for the next pulse.

Figure 5:
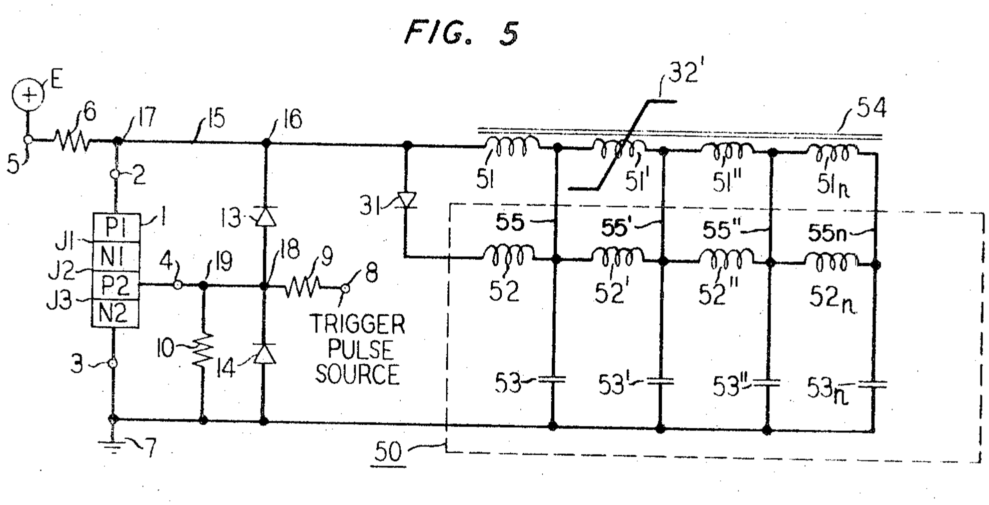
FIG. 5 shows the circuit of FIG. 3 modified with the addition of a pulse forming network for use with high load currents.

When the thyristor switch circuit of this invention is used with high load currents, it is preferable to modify the circuit of FIG. 3 by substituting a pulse forming network 50 in place of the inductor 11 and capacitor 12 as is shown in FIG. 5. This pulse forming network 50 includes a number of inductors 52, 52', 52'', and $52_n$ connected in series and a plurality of capacitors 53, 53', 53'', and $53_n$ which are connected in parallel with the ground 7. The saturable reactor 32 of FIG. 3 has been replaced by a tapped saturable reactor 32' having a number of windings 51, 51', 51'', and $51_n$ on a long core 54. The reactor 32' also has a number of taps 55, 55', 55'', and $55_n$ each of which extends downward to a respectively different one of the capacitors 53, 53', 53'', and $53_n$. The taps 55, 55', 55'', and $55_n$ are also connected to the inductors 52, 52', 52'', and $52_n$ in the manner shown in FIG. 5. The diode 31 is retained and has its anode connected to the reactor 32' while its cathode is connected to the series of inductors 52, 52', 52'', and $52_n$.

This circuit construction, in effect, constitutes a series or chain of circuits based on the same principle as the circuit shown in FIG. 3, namely, a diode connected in series with an inductor and a capacitor and having a saturable reactor in shunt across the serially connected diode and inductor.

I claim:

1. A switch circuit adapted for generating a pulse of electric energy, said switch circuit comprising:
- a source of electric power;
- a normally nonconductive thyristor having anode and cathode terminals;
- a utilization circuit coupling said source of electric power to said anode terminal;
- starting means adapted for triggering said thyristor for rendering it conductive whereby a pulse is generated across said utilization circuit;
- said starting means including a gate terminal connected to said thyristor and adapted to receive electric energy for triggering said thyristor, and a resonant turnoff circuit adapted for producing one cycle of ringing current for turning off said thyristor for effecting the termination of the generation of said pulse and for limiting the duration of the width of said pulse to an extent of time that is less than the duration of said one cycle of ringing current;
- said turnoff circuit having one side connected to both said anode terminal and to said utilization circuit and having another side connected to said cathode terminal;
- said turnoff circuit including a serially connected inductor and capacitor;
- said one cycle of ringing current having a first half-cycle and a second half-cycle;
- said switch circuit being characterized in that it further comprises reducing means for rendering the duration of said first half-cycle of ringing current substantially shorter than the duration of said second half-cycle of ringing current for thereby reducing the width of said pulse;
- said reducing means comprising a shunt path connected across said inductor;
- said shunt path having a saturable reactor connected therein; and
- said reducing means further comprising blocking means for blocking the flow of said first half-cycle of ringing current through said inductor.

2. A switch circuit in accordance with claim 1 wherein said blocking means include a diode having an anode and a cathode, and wherein said blocking means further include circuit means for connecting said anode of said diode to one end of said saturable reactor, and additional circuit means for connecting said cathode of said diode through said inductor to said capacitor and also to another end of said saturable reactor.

3. A switch circuit adapted for generating a pulse of electric energy, said switch circuit comprising:
- a source of electric power;

a normally nonconductive thyristor having anode and cathode terminals;

a utilization circuit coupling said source of electric power to said anode terminal;

starting means adapted for triggering said thyristor for rendering it conductive whereby a pulse is generated across said utilization circuit;

said starting means including a gate terminal connected to said thyristor and adapted to receive electric energy for triggering said thyristor, and a turnoff circuit adapted for turning off said thyristor for effecting the termination of the generation of said pulse;

said turnoff circuit having one side connected to said anode terminal and another side connected to said cathode terminal;

said switch circuit being characterized in that it further comprises means for reducing the width of said pulse; and said means including a pulse forming network comprising a chain of essentially similar circuits each including a capacitor and an inductor, a saturable reactor having a plurality of taps, and circuit means for connecting each of said taps to a respectively different one of said similar circuits.

4. A switch circuit in accordance with claim 3 and further comprising a diode having an anode and a cathode, circuit means for connecting said anode of said diode to said tapped reactor, and additional circuit means for connecting said cathode of said diode to said chain of similar circuits.

5. A switch circuit having a thyristor adapted for generating a pulse of electric energy:

said switch circuit comprising a resonant turnoff circuit adapted for producing one cycle of ringing current for turning off said thyristor for effecting the termination of the generation of said pulse and for limiting the duration of the width of said pulse to an extent of time that is less than the duration of said one cycle of ringing current;

said one cycle of ringing current comprising a first half-cycle and a second half-cycle having a trailing end;

said turnoff circuit including a capacitor and a discharge path for said capacitor;

said discharge path comprising an inductor connected in series with said capacitor;

said switch circuit being characterized in that it includes reducing means for rendering the duration of said first half-cycle of ringing current substantially shorter than the duration of said second half-cycle of ringing current for reducing the on-off time interval of said thyristor and for thereby effecting a reduction in the width of said pulse;

said reducing means comprising an alternative discharge path for said capacitor;

said alternative discharge path including a saturable reactor connected in series with said capacitor and in parallel to said inductor;

blocking means for blocking said discharge path through said inductor only during said first half-cycle of said ringing current;

said saturable reactor having a core, and resetting means for automatically resetting said core of said reactor when said pulse is terminated; and said resetting means comprising the trailing end of said second half-cycle of said ringing current.